United States Patent [19]

Henig

[11] 4,249,093
[45] Feb. 3, 1981

[54] MULTIPLE REQUEST ARBITRATION CIRCUIT

[75] Inventor: Sammy S. Henig, Clifton, N.J.

[73] Assignee: Lockheed Electronics Co., Inc., Plainfield, N.J.

[21] Appl. No.: 940,304

[22] Filed: Sep. 6, 1978

[51] Int. Cl.³ .............................................. H03K 5/22
[52] U.S. Cl. .................................... 307/232; 307/241; 328/137; 340/147 LP
[58] Field of Search ............... 307/232, 241, 208, 217, 307/293; 328/99, 152, 137; 340/147 LP

[56] References Cited
U.S. PATENT DOCUMENTS 3,824,409 7/1974 Patil ..................................... 307/232

Primary Examiner—Davis L. Willis
Assistant Examiner—Thomas P. O'Hare

[57] ABSTRACT

Multiple usage requests for a common resource, such as a memory system, are given usage priorities by a multiple request arbitration circuit. Priority is given to a predetermined one of the input signals occurring prior to any one of the remaining input signals and priority is also given to the one input signal if it occurs within a predetermined interval subsequent to any one of the remaining input signals. The circuit also provides for the suppression of voltage transients which may occur upon the essentially simultaneous occurrence of more than one input signal and the circuit also provides a faster access time for input signals other than the predetermined one of the input signals.

13 Claims, 1 Drawing Figure

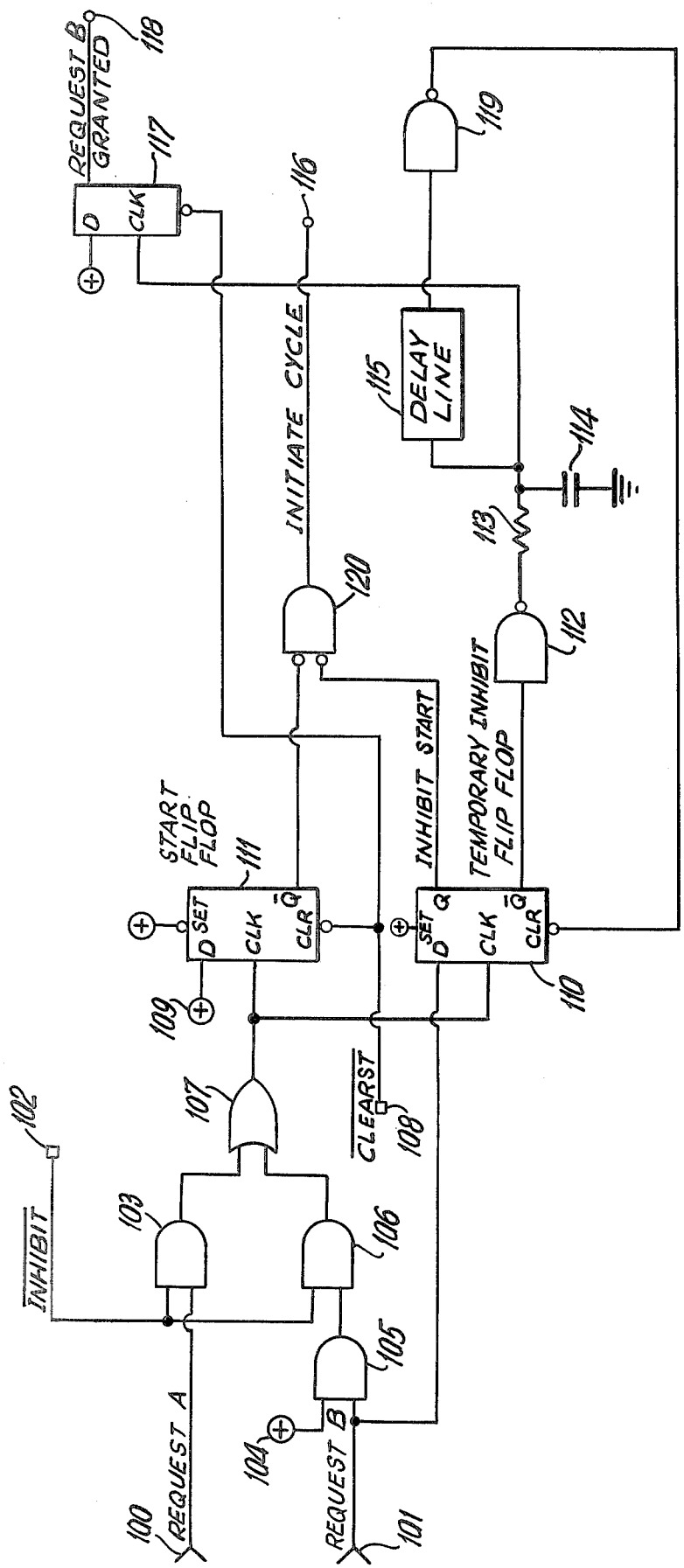

MULTIPLE REQUEST ARBITRATION CIRCUIT

FIELD OF THE INVENTION

This invention relates to arbitration circuits and more particularly to a circuit for granting absolute priority to one of a plurality of usage requests while providing better access time to another of the plurality of usage requests.

BACKGROUND OF THE INVENTION

It is well known in electronic systems for a common resource, such as a memory system, to be utilized by a number of individual system elements or subsystems. Such sharing of a common resource necessarily requires that each subsystem utilizing the common resource be given a usage priority. In addition, in many systems, it is often required that one of the plurality of subsystems be given priority over the remaining subsystems or alternatively that one subsystem have a faster access time than the remaining subsystems.

In order to accomplish the required delegation of usage priorities it is necessary to utilize apparatus to arbitrate between the various usage requests. Prior art arbitration apparatus suffers from several disadvantages. One of these is that much of the prior art arbitration apparatus is unduly complex and expensive. Another disadvantage in the prior art is the inability of the prior art apparatus to grant priority to one of a plurality of requests notwithstanding the fact that the one request is detected subsequent to one or more of the remaining requests. Finally, much of the prior art arbitration apparatus suffers from the electrical noise problem wherein when two or more requests arrive at substantially the same time the apparatus often generates an unwanted voltage transient which can cause circuit malfunction.

It is therefore, an object of this invention to provide arbitration apparatus which is simple and inexpensive.

It is another object of this invention to provide arbitration apparatus which can grant priority to one of a plurality of requests notwithstanding the fact that the one request is detected subsequent to the remaining requests, while providing faster access time to another one of the plurality of requests.

It is a further object of this invention to provide arbitration apparatus which solves the "glitch" problem inherent in the prior art.

SUMMARY OF THE INVENTION

In accordance with a first feature of the invention, the occurrence of input signals, representing requests to be granted, is detected and priority is given to one of the input signals occurring prior to the remaining input signals. Priority is also given if the one input signal occurs within a predetermined interval subsequent to the occurrence of any one of the remaining input signals.

It is another feature of the invention that other ones of the input signals are given faster access time than the one high priority input signal.

It is a further feature of the invention that voltage transients, which may be caused by the essentially simultaneous occurrence of more than one of the input signals, are suppressed.

The foregoing and other objects and feature of this invention will be more fully understood from the following description taken in conjunction with the accompanying drawing.

BRIEF DESCRIPTION OF THE DRAWING

The FIGURE illustrates a schematic diagram of a multiple request arbitration circuit in accordance with the instant invention.

DETAILED DESCRIPTION

Refer to the FIGURE wherein there is shown a multiple request arbitration circuit in accordance with the instant invention. Requests A and B, present at input terminals 100 and 101, are input signals which represent requests from a remote circuit subsystem to utilize a common resource such as a memory system. Although the circuit in the FIGURE illustrates the arbitration of only two requests it is to be understood that the inventive concepts described herein are not limited to two requests but can be applied to circuits which arbitrate a plurality of requests.

The circuit in the FIGURE performs the following functions:

(1) Grants Request B, if the signal representing Request B occurs before the signal representing Request A;

(2) Grants Request B, if the signal representing Request A and the signal representing B occur at substantially the same time;

(3) Grants Request B if the signal representing Request A occurs first and the signal representing Request B occurs a predetermined interval subsequent to the signal representing Request A. The predetermined interval referred to herein is defined as being equal to the "set-up" time of flip-flop 110.

(4) Grants Request A if the signal representing Request A occurs before the signal representing Request B and the signal representing Request B does not occur within the predetermined interval subsequent to Request A.

(5) Eliminates any spurious transients which could develop when the signal representing Request B occurs subsequent to the signal representing Request A and at a time equal to the upper limit of the "set-up" time of flip-flop 110; and (6) Provides a better response time for Request A than for Request B when the conditions in function 4 above are met. Each of the foregoing circuit functions will now be described in detail hereinafter.

Assume that Request B occurs prior to Request A. Terminals 102 and 104 are normally tied to a "high" voltage level (logical "1" for conventional current sinking logic) so that gates 103, 105 and 106 are normally enabled. The input signal representing Request B (logical "1") will be passed through gates 105–107 and will be applied to the clock (CLK) inputs of edge triggered (D-type) flip-flops 110 and 111. The input signal representing Request B will also be applied to the data (D) input of flip-flop 110 while the D input of flip-flop 111 is maintained "high". The occurrence of the input signal representing Request B will therefore serve to place flip-flops 110 and 111 in the SET condition.

Placing flip-flop 110 in the SET condition disables gate 120 via the associated inverting input terminal thereof, thereby inhibiting the initiate cycle signal at an output terminal 116, and also applies a logical "1" to resistance-capacitance (RC) network 113 and 114 via inverter 112. Subsequent to the minor delay imposed by the RC network the logical "1" is applied to delay line 115 and to the CLK input of flip-flop 117. In response thereto, flip-flop 117 is SET, applying a logical "1" to output terminal 118 and thereby indicates to the common resource that request B is to be granted.

Delay line 115 imposes a sufficient delay on the logical "1" present at the output of gate 112 to allow the common resource to detect the fact that Request B is to be granted. Subsequent to the delay imposed by delay line 115 a logical "1" is applied from the output of delay line 115 to the input of gate 119, which inverts this signal and applies a logical "0" to the clear (CLR) input of flip-flop 110, thereby placing this flip-flop in the CLEAR state. In response thereto, gate 120 is enabled (flip-flop 111 is still SET) and a logical "1" is applied to terminal 116 indicating to the common resource that Request B can be processed.

For a description of the second circuit function, assume that the input signals representing Requests A and B occur at substantially the same time. In this instance the signals representing Requests A and B will be passed through gates 103 and 105 and 106 respectively and both signals are passed through gate 107 and applied to the CLK inputs of flip-flops 110 and 111. Due to the occurrence of Request B applying a logical "1" to the D input of flip-flop 110, flip-flop 110 will be placed in the SET condition and therefore Request B will be granted in the manner detailed above.

The third circuit function is described by assuming that Request A occurs first but Request B occurs soon enough after Request A to meet the "set-up" time of flip-flop 110. The "set-up" time of flip-flop 110 is defined as the time in which the signal representing Request B must be present at the D input of flip-flop 110 in order to place this flip-flop in the SET condition. When this condition occurs the signal representing Request A will be applied to the CLK input of flip-flop 110 but the signal representing Request B will occur soon enough thereafter to place flip-flop 110 in the SET condition. When this occurs Request B will be granted in the manner detailed above.

For a description of the fourth and sixth circuit functions, assume that the signal representing Request A occurs prior to the signal representing Request B and the signal representing Request B does not occur within the "set-up" time of flip-flop 110. In this instance flip-flop 111 will be placed in the SET state in response to the signal representing Request A while flip-flip 110 will not be placed in the SET state. In this instance, gate 120 will be enabled and a logical "1" will be applied to terminal 116. Due to the fact that flip-flop 117 has not been placed in the SET state the common resource will be alerted that Request A should be granted and the common resource will commence the processing of Request A. Note that due to the fact that flip-flop 110 was not placed in the SET condition, delay line 115 was not enabled. Request A was thus granted immediately—and with a faster response time than the granting of Request B.

For a description of the final circuit function, assume that the signal representing Request B occurs subsequent to the signal representing Request A but that the occurrence of the signal representing Request B takes place at the upper limit for the "set-up" time of flip-flop 110. In this instance, it is uncertain whether flip-flop 110 will be placed in the SET condition and moreover this uncertainty may result in the occurrence of a very sharp and rapid voltage transient at the output of flip-flip 110.

Such a noise transient could, in the prior art, result in improper circuit operation. However, in the circuit of the instant invention such noise is suppressed by RC network 113 and 114 on the $\overline{Q}$ output of flip-flop 110. Noise suppression is accomplished on the Q output of flip-flop 110 by the delay (for the duration of the transient) introduced by gate 120, as gate 120 is momentarily disabled by the transient. Suppressing the transient in this manner is advantageous since the transient is suppressed without introducing unnecessary delay in the circuit critical path. The only delay introduced into the critical path occurs when gate 120 is momentarily disabled by the transient, a condition which rarely occurs. Eliminating the noise transient prevents improper circuit operation.

The circuit in the FIGURE has an inhibit terminal at 102 which can function to disable circuit operation when required. More particularly, a logical "0" applied to terminal 102 disables gates 103 and 106 and thereby prevents detection of the signals representing Requests A or B. Alternatively, a logical "1" applied to terminal 102 enables the circuit to perform in the manner described above.

Terminal 108 is utilized to reset the circuit subsequent to a circuit operation. This is accomplished by simply applying a logical "0" to terminal 108 to place flip-flops 111 and 117 in the CLEAR state.

Although a specific embodiment of this invention has been shown and described, it will be understood that various modifications may be made without departing from the spirit of this invention.

What is claimed is:

1. A multiple request arbitration circuit comprising;
   means for detecting the occurrence of a plurality of input signals, each input signal representing a request to be granted by the arbitration circuit; and,
   means responsive to the detecting means for granting the request represented by one of the input signals and for denying the requests represented by the remaining input signals upon the occurrence of the one input signal prior to the occurrence of the remaining input signals and also upon the occurrence of the one input signal a first predetermined interval subsequent to the occurrence of any one of the remaining input signals, said granting and denying means including means for delaying the granting of said one request by a second predetermined interval subsequent to the detection of said one input signal.

2. A multiple request arbitration circuit in accordance with claim 1 wherein the detecting means includes bi-stable means for assuming a first state in response to the occurrence of the one input signal prior to the occurrence of the remaining input signals.

3. A multiple request arbitration circuit in accordance with claim 2 wherein said bi-stable means assumes the first state in response to the occurrence of the one input signal a predetermined interval subsequent to the occurrence of any one of the remaining input signals.

4. A multiple request arbitration circuit in accordance with claim 3 wherein the bi-stable means assumes a second state in response to the occurrence of any one of the remaining input signals, more than the predetermined interval, prior to the occurrence of the one input signal, whereby the request represented by the one remaining input signal is granted.

5. A multiple request arbitration circuit in accordance with claim 4 wherein there is further included RC circuit means connected to an output of said bi-stable means for eliminating voltage transients occurring at the time said bi-stable means assumes said first or second states.

6. A multiple request arbitration circuit in accordance with claim 4 wherein said delaying means is not operative when granting the request represented by the occurrence of any one of the remaining input signals prior to the occurrence of said one input signal.

7. A multiple request arbitration circuit in accordance with claim 3 wherein said bi-stable means assumes said first state in response to the simultaneous occurrence of said one input signal and any one of the remaining input signals.

8. A multiple request arbitration circuit in accordance with claim 1 wherein said bi-stable means is responsive to said delaying means for assuming said second state subsequent to the termination of said second predetermined interval.

9. A multiple request arbitration circuit comprising; means for detecting the occurrence of a plurality of input signals, each input signal representing a request to be granted by the arbitration circuit; and
    means responsive to said detecting means for granting the request represented by one of the input signals and for denying the requests represented by the remaining input signals upon the occurrence of the one input signal prior to the occurrence of the remaining input signals and also upon the occurrence of the one input signal a predetermined interval subsequent to the occurrence of any one of the remaining input signals, said detecting means including bi-stable means for assuming a first state in response to the occurrence of the one input signal prior to the occurrence of the remaining input signals, wherein said bi-stable means assumes said first state in response to the simulataneous occurrence of the one input signal and any one of the remaining input signals.

10. The multiple request arbitration circuit in accordance with claim 9, wherein said bi-stable means assumes the first state in response to the occurrence of the one input signal a predetermined interval subsequent to the occurrence of any one of the remaining input signals.

11. The multiple request arbitration circuit in accordance with claim 9, wherein said bi-stable means assumes said first state in response to the simultaneous occurrence of the one input signal and any one of the remaining input signals.

12. The multiple request arbitration circuit in accordance with claim 11, wherein said granting and denying means includes means for delaying the granting of said one request a second predetermined interval subsequent to the detection of the one input signal.

13. The multiple request arbitration circuit in accordance with claim 11, wherein said delaying means is not operative when granting the request represented by the occurrence of any one of the remaining input signals prior to the occurrence of the one input signal.

* * * * *